United States Patent
Wu et al.

(10) Patent No.: US 10,559,561 B2
(45) Date of Patent: Feb. 11, 2020

(54) ISOLATION ENHANCEMENT WITH ON-DIE SLOT-LINE ON POWER/GROUND GRID STRUCTURE

(71) Applicant: Xilinx, Inc., San Jose, CA (US)

(72) Inventors: Zhaoyin D. Wu, San Jose, CA (US); Parag Upadhyaya, Los Gatos, CA (US); Kun-Yung Chang, Los Altos Hills, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/875,568

(22) Filed: Jan. 19, 2018

(65) Prior Publication Data

US 2019/0229113 A1    Jul. 25, 2019

(51) Int. Cl.
| | | |
|---|---|---|
| *H01L 21/00* | (2006.01) | |
| *H01L 27/02* | (2006.01) | |
| *H01L 21/76* | (2006.01) | |
| *H01L 21/762* | (2006.01) | |
| *H01L 21/768* | (2006.01) | |
| *H01L 21/84* | (2006.01) | |
| *H01L 23/522* | (2006.01) | |
| *H01L 23/64* | (2006.01) | |

(52) U.S. Cl.
CPC ...... *H01L 27/0288* (2013.01); *H01L 21/7602* (2013.01); *H01L 21/76297* (2013.01); *H01L 21/76895* (2013.01); *H01L 21/84* (2013.01); *H01L 23/5226* (2013.01); *H01L 23/645* (2013.01)

(58) Field of Classification Search
None
See application file for complete search history.

(56) References Cited

U.S. PATENT DOCUMENTS

| | | | |
|---|---|---|---|
| 5,752,182 A * | 5/1998 | Nakatsuka | ............ H01L 23/645 257/E25.029 |
| 6,621,141 B1 | 9/2003 | Van Schuylenbergh et al. | |
| 2006/0226510 A1 | 10/2006 | Goren et al. | |
| 2016/0315373 A1 | 10/2016 | Azad et al. | |

* cited by examiner

*Primary Examiner* — Reema Patel
(74) *Attorney, Agent, or Firm* — Carleton Clauss (57) ABSTRACT

Examples herein describe techniques for isolating portions of an IC that include sensitive components (e.g., inductors or capacitors) from return current in a grounding plane. An output current generated by a transmitter or driver in an IC can generate a magnetic field which induces return current in the grounding plane. If the return current is proximate the sensitive components, the return current can inject noise which can negatively impact other components in the IC. To isolate the sensitive components from the return current, embodiments herein include forming slots through the grounding structure which includes the grounding plane on one or more sides of the sensitive components.

19 Claims, 9 Drawing Sheets

FIG. 9

US 10,559,561 B2

ISOLATION ENHANCEMENT WITH ON-DIE SLOT-LINE ON POWER/GROUND GRID STRUCTURE

TECHNICAL FIELD

Examples of the present disclosure generally relate to isolating passive components in an integrated circuit (IC) using slots.

BACKGROUND

Transmitters and other driving circuits in IC can output signals which result in significant return current in a grounding plane. Put differently, the transmitters generate a current for driving, e.g., a clocking or power network, which in turn generates a magnetic field that induces a return current. Typically, the return current flows to a sink in the transmitter. However, the direction and source of the return current is difficult to control and predict when designing the IC. If a significant amount of return current flows near a passive component in or on the IC (e.g., an inductor or capacitor), the return current can inject noise which can affect the function of other devices in the IC that include the passive components—e.g., oscillators or phase locked loops. Thus, being able to isolate passive components from the return current can improve the functionality of the IC.

SUMMARY

Techniques for operating and fabricating integrated circuits are described. One example is an integrated circuit that includes a grounding structure, a source, and a transmitter where when the transmitter is active, return current flows through the grounding structure from the source to the transmitter. The integrated circuit also includes a passive component disposed between the source and the transmitter, a first slot extending through the grounding structure where the first slot is between the passive component and the source, and a second slot extending through the grounding structure, wherein the second slot is between the passive component and the transmitter where respective first ends of the first and second slots terminate at an edge of the grounding structure.

One example described herein is an integrated circuit that includes a grounding structure, a source, and a sink where return current flows through the grounding structure from the source to the sink. The integrated circuit also includes an inductor disposed between the source and the sink and a first slot extending through the grounding structure where the first slot is between the inductor and the source and where a first end of the first slot terminates at an edge of the grounding structure.

One example described herein is a method that includes forming active devices in an active region of a semiconductor substrate, forming a grounding structure over the active region of the semiconductor substrate, cutting a first slot and a second slot through the grounding structure, and forming a passive component above the grounding structure and between the first slot and the second slot where respective first ends of the first and second slots terminate at an edge of the grounding structure.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples herein describe techniques for isolating portions of an IC that include sensitive components (e.g., inductors or capacitors) from return current in a grounding plane. As mentioned above, an output current generated by a transmitter or driver in an IC can generate a magnetic field which in turn induces return current in the grounding plane. If the return current is proximate to sensitive components, the return current can inject noise which can negatively impact other devices in the IC. To isolate the sensitive components from the return current, embodiments herein include forming slots through the grounding structure which includes the grounding plane on one or more sides of the sensitive components.

In one embodiment, the slots each have a first end that is open and a second end that is short circuited. The open end may extend to an edge of the grounding structure such that return current flowing through the grounding structure cannot flow around the open end. For example, the open end of the slot may terminate at the furthest edge of the grounding structure such that there is no conductive path in the ground plane around the open end. In contrast, the short circuit end terminates within the grounding structure such that the return current can flow around this end of the slot. In one embodiment, the sensitive component is disposed between two parallel slots thereby forcing any return current that would, in the absence of the slots, flow near the sensitive component to instead flow around the short circuit ends of the slots thereby mitigating the impact of the return current on the component.

Figure 1:
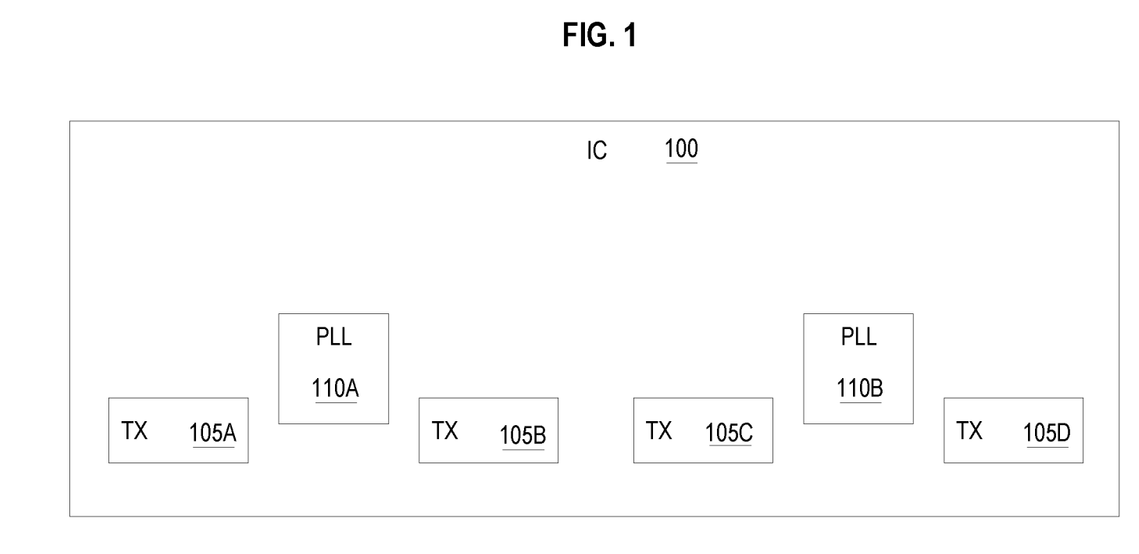
FIG. 1 is a block diagram of an integrated circuit, according to an example.

FIG. 1 is a block diagram of an IC 100, according to an example. The IC 100 includes four transmitters (TX) 105 along with two phase locked loops (PLL) 110. Although not shown, the IC 100 can include many different circuit blocks and circuitry such as processor blocks, non-programmable circuit blocks (e.g., digital signal processing blocks, memory, registers), and programmable circuit blocks (e.g., configurable logic blocks). In one embodiment, the IC 100 is a non-programmable chip such as a processor or application specific IC (ASIC). In another embodiment, the IC 100 is a programmable chip such as a field programmable gate array (FPGA). In one embodiment, the transmitters 105 provide clock signals for a clock network but are not limited to such and may drive data signals, power signals, and the like.

In one embodiment, the PLL 110 provides a control signal to the transmitters 105 which set the frequency of a clock signal outputted by the transmitters 105. However, the currents driven by the transmitters 105 can induce a return current which can negatively affect the clock signals outputted by the transmitters 105. In one embodiment, the transmitters 105 may not use the closest PLL 110 to generate their clock signals. That is, in some configurations, the transmitter 105A which is disposed on the left side of the IC 100 may use the control signal outputted by the PLL 110B rather than the PLL 110A. So long as the transmitters closest to the PLL 110B are not operating, the control signal generated by the PLL 110B has little noise as a result of return currents.

However, once the transmitter 105C or the transmitter 105D near the PLL 110B begins to output a signal, the associated current and its magnetic field can generate return currents that flow near the PLL 110B. These return currents can inject noise into the passive components in the PLL 110B (e.g., an inductor or capacitor). In one embodiment, the noise in the PLL 110B results in jitter in the output signal of the transmitter 105A since it relies on the PLL 110B to generate its clock signal.

Figure 2:
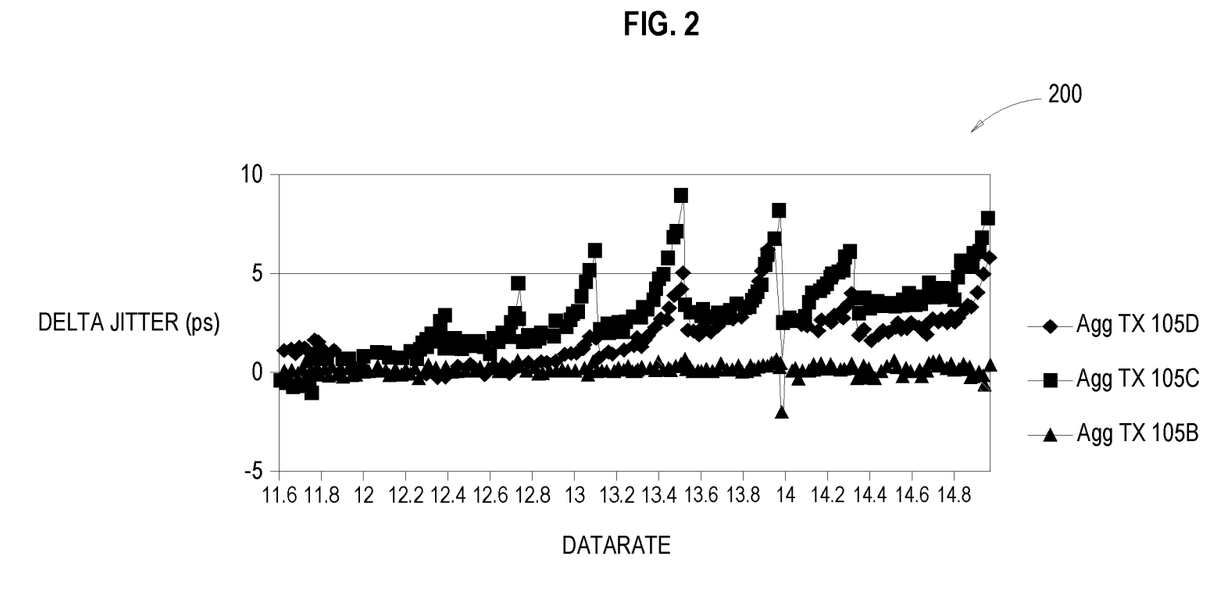
FIG. 2 is a chart illustrating the effect of return current on jitter, according to an example.

FIG. 2 is a chart 200 illustrating the effect of return current on jitter in the transmitter 105A, according to an example. The Y-axis of the chart 200 illustrates the change in jitter in the output signal of the transmitter 105A when the other transmitters are actively transmitting an output signal. The X-axis of the chart 200 illustrates the jitter at different data rates.

The triangles represent the jitter at the transmitter 105A when the transmitter 105B is active, the squares represent the jitter at the transmitter 105A when the transmitter 105C is active, and the diamonds represent the jitter at the transmitter 105A when the transmitter 105D is active. As shown, activating the transmitter 105B has little change on the jitter in the output signal of the transmitter 105A. This may be because the transmitter 105B is further away from the PLL 110B, and thus, any return current generated by activating the transmitter 105B has little effect on the passive components in the PLL 110B. As a result, the delta jitter is very small.

Activating the transmitters 105C or 105D, however, do change the jitter of the signal outputted by the transmitter 105A. That is, the chart 200 illustrates that either the transmitter 105C or 105D can generate a return current that affects the PLL 110B, and thus, increases the jitter on the output signal of the transmitter 105A.

Figure 3:
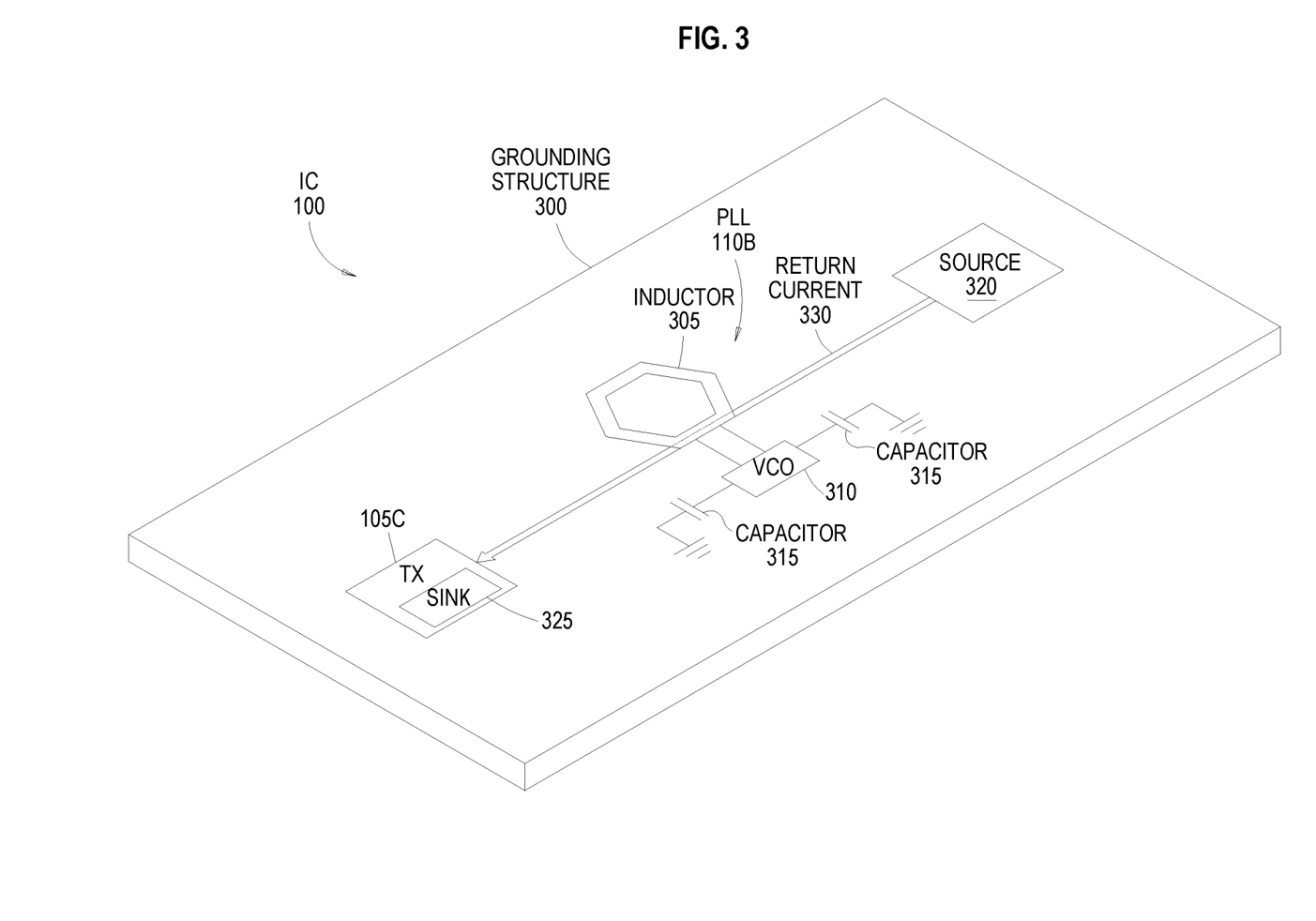
FIG. 3 is an integrated circuit with return current affecting a passive component, according to an example.

FIG. 3 illustrates return current affecting a passive component in the IC 100, according to an example. Specifically, FIG. 3 illustrates a grounding structure 300 in the IC 100 and omits other structures that may be in the IC 100 such as a semiconductor substrate and other circuitry. For simplicity, the grounding structure 300 includes the transmitter 105C and the PLL 110B shown in FIG. 1 but omit the other transmitters and PLL. However, the embodiments described below can equally apply to the transmitter 105D or to the transmitters 105A and 105B and their effect on the PLL 110A.

When driving a current using the transmitter 105C, the resulting magnetic field can generate a return current 330 at a source 320. Although only one path of the return current 330 is shown, there may be multiple paths of the return current through the grounding structure 300. Generally, the return current 330 flows from various sources in the IC 100 back towards a sink 325 in the transmitter 105C through the grounding structure 300.

In one embodiment, the source 320 may be a Controlled Collapse Chip Connection (i.e., a c4 solder bump) which is affected by the magnetic field more strongly than other components in the IC or underlying package (not shown). Thus, the current density of the return current in the path between the source 320 and the sink 325 may be greater than in other areas of the grounding structure 300. Because an inductor 305 and capacitors in the PLL 110B are on, or near, the path of the return current 330, the return current 330 can inject noise which then affects the jitter in a transmitter (or transmitters) that rely on the output of the PLL 110B.

In one embodiment, the inductor 305 and the capacitors 315 form a LC tank circuit for a voltage controller oscillator (VCO) 310 in the PLL 110B. The inductors 305 and/or the capacitors 315 may be coupled to the same ground plane in the grounding structure 300 in which flows the return current 330. Thus, the greater the current density of the return current 330 in the portion of the ground plane near the PLL 110B, the greater the effect the return current 330 may have on the operation of the inductor 305 and the capacitors 315.

The embodiments that follow describe different techniques for isolating the sensitive components in the PLL 110B (e.g., the inductor 305 and the capacitors 315) from the return current 330. Put differently, reducing the amount of return current 330 that flows near the PLL 110B in the ground plane can reduce the noise in the PLL 110B thereby improving the quality of the control signal outputted by the PLL 110B.

Figure 4:
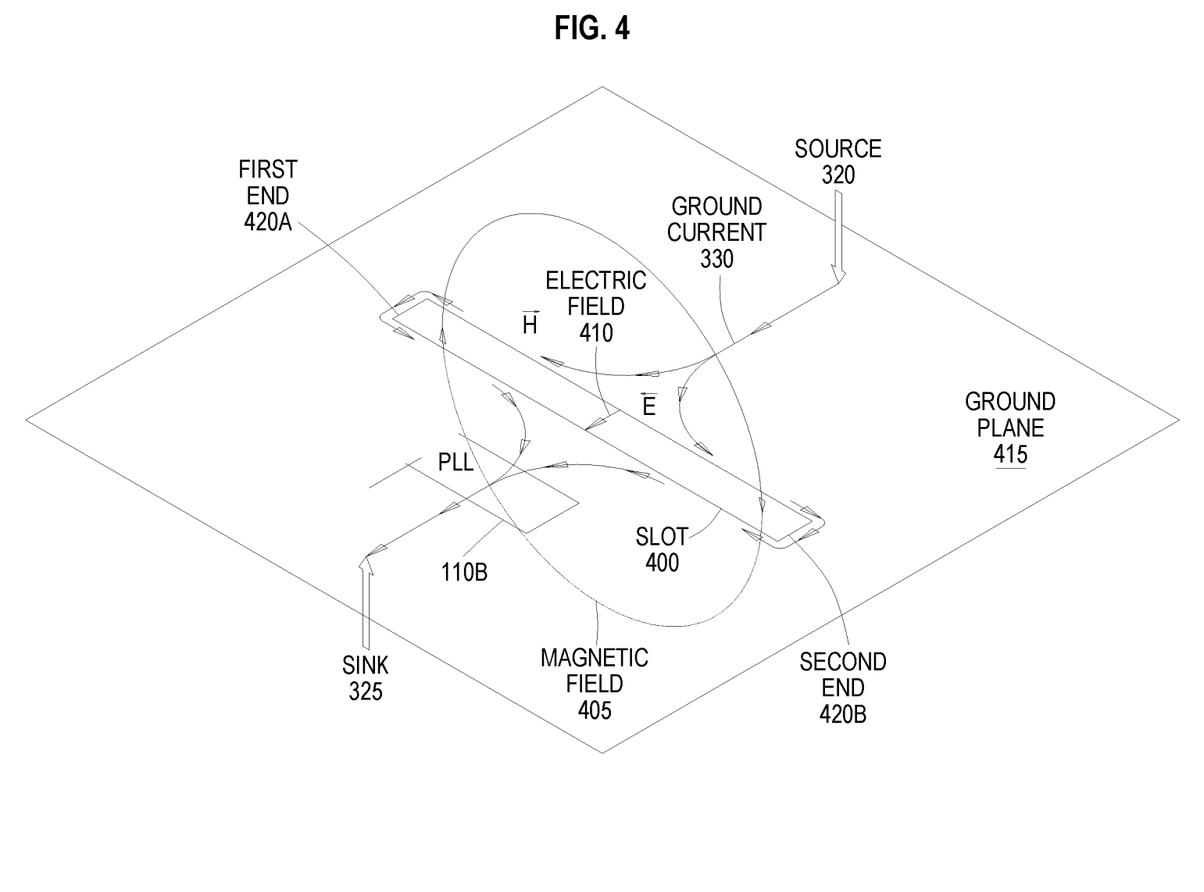
FIG. 4 illustrates blocking return current using a slot with two short circuit ends, according to an example.

FIG. 4 illustrates blocking return current using a slot 400 with two short circuit ends, according to an example. Like in FIG. 3, FIG. 4 illustrates a return current flowing from the source 320 to the sink 325 in a ground plane 415. In this illustration, the return current is represented by the plurality of arrows that illustrate the path of the return current as it flows from the source 320 to the sink 325 in the ground plane 415. In addition, FIG. 4 illustrates a magnetic field 405 and electrical field 410 associated with the return current.

To isolate the PLL 110B from the return current, the slot 400 is cut through the ground plane 415 thereby creating an insulative region through which the return current cannot flow. Instead, as the return current approaches the slot 400, the arrows split into a Y-shape indicating that a first portion of the return current flows around a first end 420A of the slot 400 while a second portion of the return current flows around a second end 420B of the slot 400. The first and second portions of the return current then recombine before flowing to the sink 325. Of course, the arrows representing the return current are simplified representations of the path the return current may take in the ground plane 415. For example, some of the return current may not recombine after flowing around the ends 420 but instead travel directly to the sink 325 in a general straight line.

In FIG. 4, the ends 420 are referred to as short circuit ends since the slot 400 terminates within the ground plane 415 thereby providing a conductive path for the return current to flow around and then recombine on the other side of the slot 400. In contrast, an open end is an end that terminates on the edge of the ground plane 415 (which are illustrated in the figures below). As such, the open end does not have a conductive path that permits the return current to flow around the slot. In other words, instead of redirecting the return current around the slot 400 using the short circuit ends 420, an open end prevents the current from flowing around the slot 400.

If most of the return current were to flow directly to the sink 325 after flowing around the ends 420, then the slot 400 would be successful at isolating the PLL 110B from the majority of the return current. That is, the highest density of the return current would be to the left and right of the PLL 110B rather than flowing through it. However, as shown, although the slot 400 redirects the return current around the ends 420, most of the current recombines on the other side of the slot 400 as it flows towards the sink 325. As such, a significant portion of the return current flows in a portion of the ground plane 415 that is at or near the PLL 110B thereby resulting in the problems described above. In fact, simulations have shown that the slot 400 can reduce the coupling between the PLL 110B and the return current by only 10-20%. Thus, while the slot 400 does reduce the coupling between the PLL 110B and the return current, the slot structures described below can provide better results.

Figure 5:
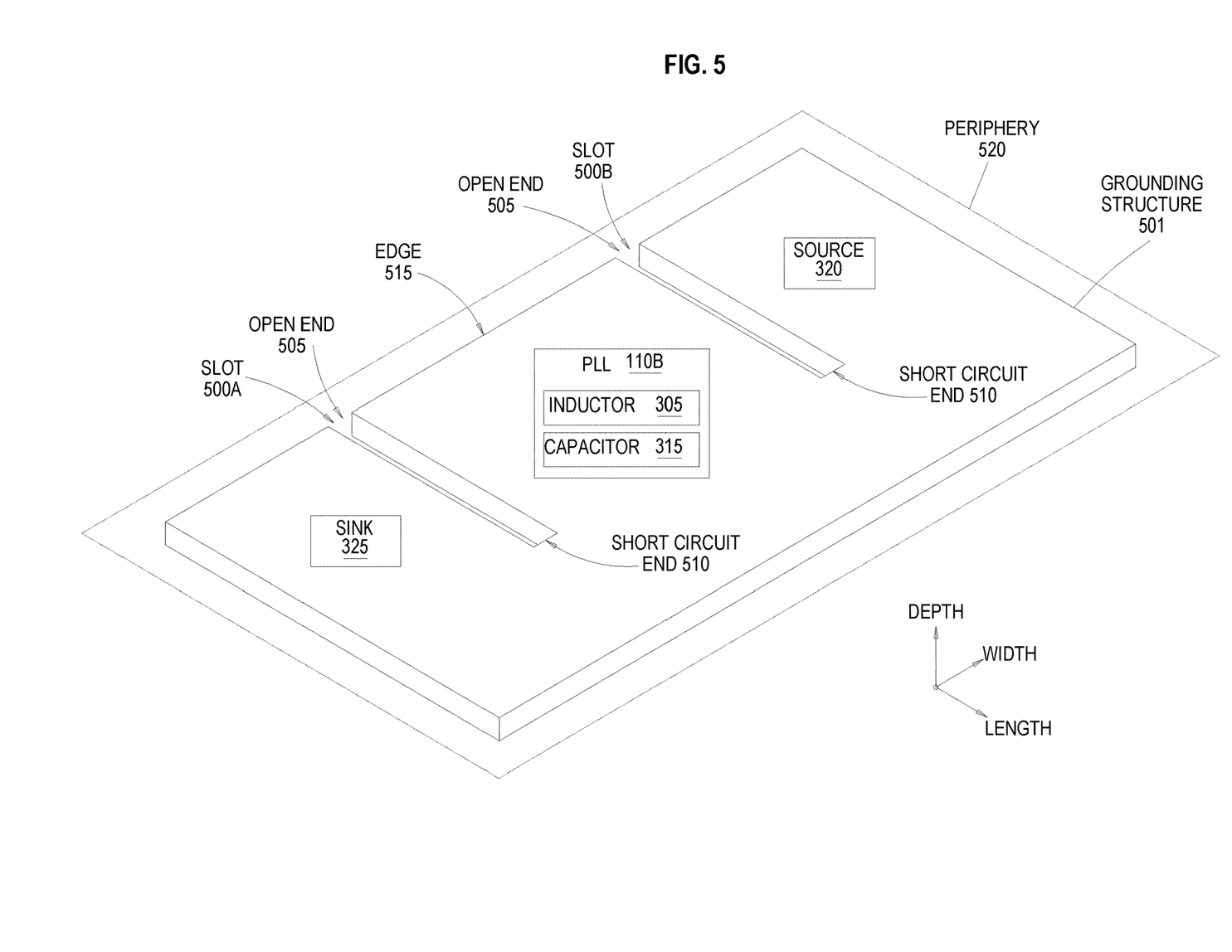
FIG. 5 is a grounding structure with two slots for isolating a passive component from return current, according to an example.

FIG. 5 is a grounding structure 501 with two slots 500 for isolating a passive component from return current, according to an example. The grounding structure 501 may include multiple layers (e.g., multiple metal routing layers) that are disposed below or above the sink 325, PLL 110B, and the source 320. In one embodiment, one or more of the layers in the grounding structure 501 form a ground plane through which return current flows between the source 320 and sink 325 which can negatively affect the inductor 305 and/or the capacitor 315 in the PLL 110B. In one embodiment, the grounding structure 501 forms an on die power grid for an IC.

In this embodiment, the PLL 110B is isolated from the source 320 and the sinks 325 by respective slots 500. One of the slots 500 (i.e., the slot 500B) is disposed between the PLL 110B and the source 320 while the slot 500A is between the PLL 110B and the sink 325. In this embodiment, the slots 500 extend in parallel but this is not a requirement. For example, the slots 500 may extend in different directions through the grounding structure 501 so long as slots 500 are between the PLL 110B and the source 320 and between the PLL 110B and the sink 325.

As mentioned above, the sink 325 may be part of a circuit (e.g., a transmitter) driving a signal in the IC. As a result, the signal causes a return current (not shown) to flow between the source 320 and the sink 325 in the grounding structure 501. However, the slots 500 mitigate the amount of the return current that flows at or near the PLL 110B thereby reducing the negative impact the return current has on the inductor 305 and capacitors 315.

In FIG. 5, instead of the slots 500 having two short circuit ends, each of the slots 500 includes one short circuit end 510 and one open end 505. As illustrated later, the return current can flow around the short circuit ends 510 in the grounding structure 501 but cannot flow around the open ends 505. As such, the slots 500 force essentially all of the return current from the source 320 to flow around the short circuit ends 510.

As shown, the open ends 505 terminate at an edge 515 of the grounding structure 501. In one embodiment, the edge 515 is a plane in the IC at which the metal routing layers forming the grounding structure 300 terminate. The edge 515 may be an edge of the IC; however, in FIG. 5 the grounding structure 501 is surrounded by a periphery 520 indicating that the physical dimensions of the IC may continue even though the grounding structure 501 does not. For example, the grounding structure 501 may be formed only on a portion of the surface of a semiconductor substrate forming the IC. The material at the periphery 520 (e.g., a dielectric material) can be disposed on another portion of the semiconductor substrate surrounding the portion of the substrate supporting the grounding structure 501. Terminating the open ends 505 at the edge 515 of the grounding structure 501 (and assuming the material in the periphery 520 is non-conductive) ensures the return current can flow only around the short circuit ends 510 of the slots 500.

In one embodiment, the PLL 110B and the sink 325 are purposefully formed in a portion of the IC that is near the edge 515 of the grounding structure 501. Put differently, when designing the IC, the designer places the location of the PLL 110 near the edge 515. As such, the length of the slots 500 depends on the distance from the PLL 110B to the edge 515. For instance, if the PLL 110B is placed further from the edge 515, then the length of the slots 500 is increased such that the short circuit ends 510 terminate at a distance that is further from the edge 515 than the distance between the edge 515 and the inductor 305 and capacitor 315.

The depth of the slots 500 varies depending on the thickness of the grounding structure 501 which can vary depending on the number of metal routing layers within the structure 501. In one embodiment, the depth of the slots 500 ensures the slots 500 extend through all the metal routing layers in the grounding structure 501. The width of the slots 500 is sufficient to enable the slots 500 to extend through the grounding structure when fabricating the IC. For example, the width may range from 5-10 microns.

Figure 6:
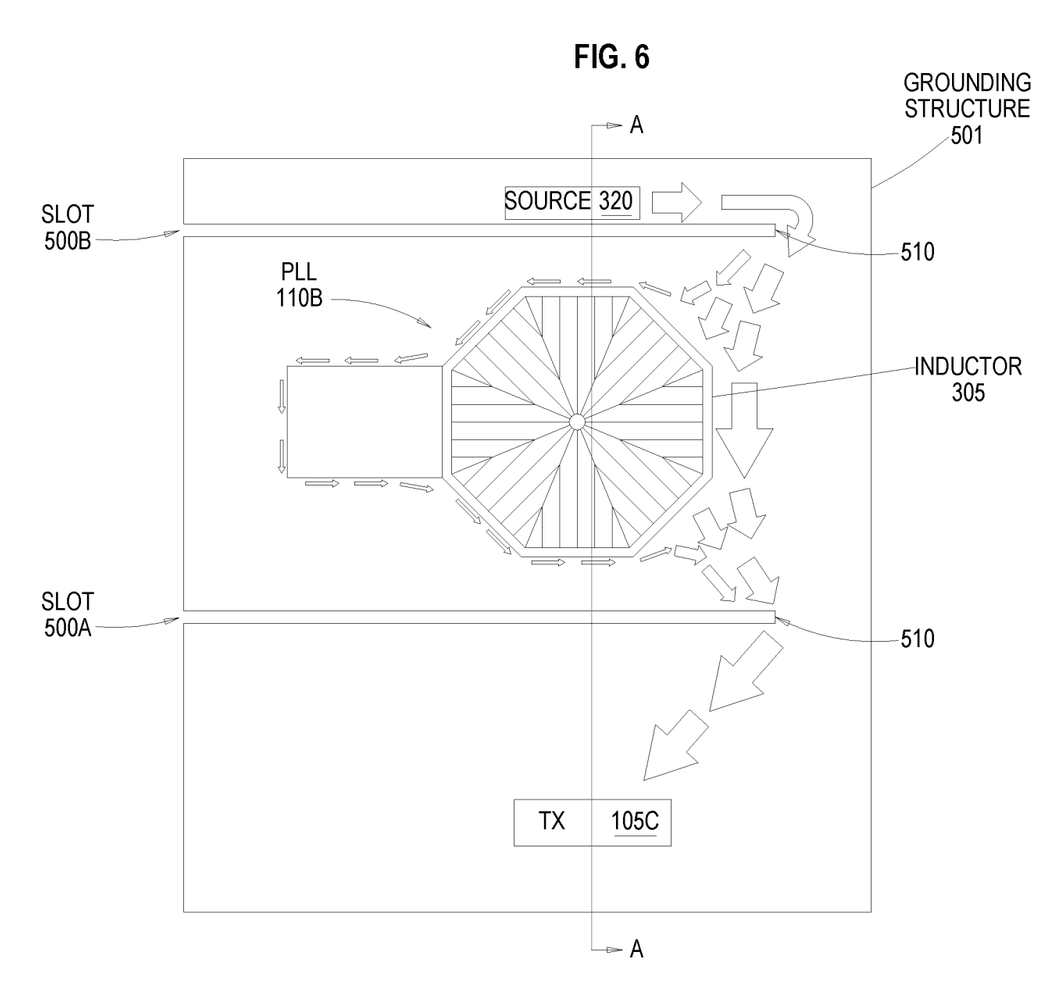
FIG. 6 illustrates a top view of the grounding structure in FIG. 5, according to an example.

FIG. 6 illustrates a top view of the grounding structure 501 in FIG. 5, according to an example. The arrows in FIG. 5 illustrate different paths the return current may take between the source 320 and the transmitter 105C (e.g., the sink). Generally, the individual thickness of the arrows indicates the density of the current in the grounding structure 501. As shown, the return current flows around the short circuit ends 510. Moreover, most of the return current (e.g., the largest current densities) are to the right of the inductor 305 in the PLL 110B. That is, comparatively little of the return current flows in the portion of the grounding structure 501 that is below the inductor 305. For example, a small amount of the return current may flow around the perimeter of the inductor 305. In this manner, the slots 500 mitigate the return current at, or near, the portion of the ground plane in the grounding structure 501 to which the inductor 305 is coupled. In one embodiment, there may be a hexagonal slot or cut out hole etched around the perimeter of the inductor 305 or an isolation wall around the inductor 305 thereby preventing the return current from flowing directly underneath the inductor 305 but these features are not necessary. In one embodiment, the spiral inductor 305 experiences a cancelling electromagnetic induction voltage at its differential leg terminals.

Although FIGS. 5 and 6 illustrate using two slots 500, in one embodiment, only one slot may be used. For example, the grounding structure 501 may include only the slot 500B which separates the source 320 from the inductor 305, or only the slot 500A which separates the inductor 305 from the transmitter 105C. Doing so may provide better results than using no slots or using the slot 400 illustrated in FIG. 4 which has two short circuit ends. In one embodiment, using both slots 500 make the return current symmetrical relative to the inductor 305, which does not occur if only one of the slots 500 is used. For example, if only one slot 500 is used, after passing the slot 500, the path of the return current is less controllable which means significant portions may pass at, or near, the inductor 305. That is, the shorter path to the sink 325 (e.g., the path with least impedance) is between the short circuit ends 510 which means the highest current density is to the right of the inductor 305.

In one embodiment, the inductor 305 may be spaced between 100-1000 microns from the transmitter 105C and the source 320.

Figure 7:
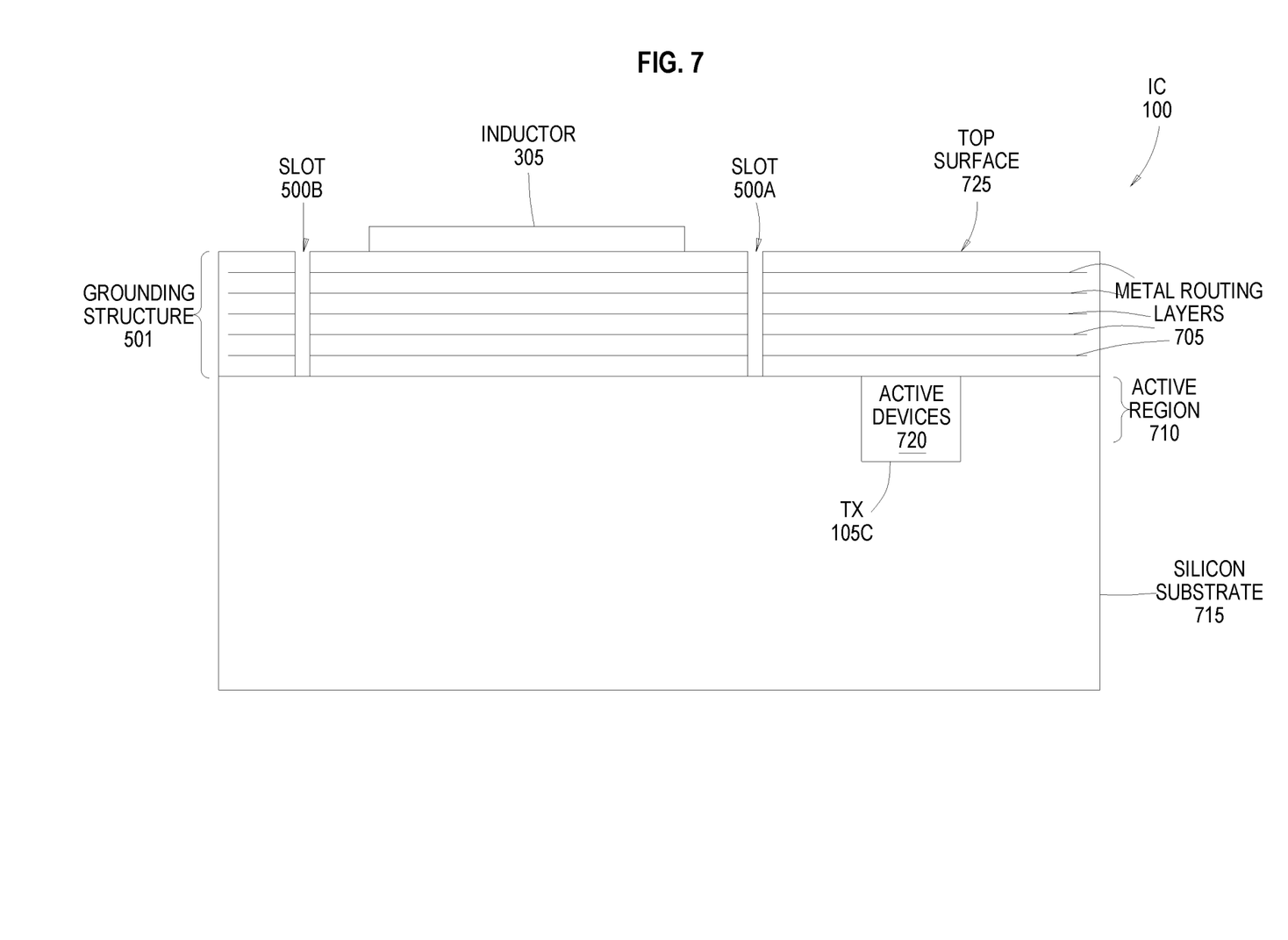
FIG. 7 is a cross-sectional view of slots in the grounding structure in FIG. 6, according to an example.

FIG. 7 is a cross-sectional view of the slots 500 in the grounding structure 501 in FIG. 6, according to an example. Specifically, FIG. 7 is a cross-sectional view taken according to the line A-A shown in FIG. 6 but the source 320 is omitted. In this example, the grounding structure 501 includes a plurality of metal routing layers 705 which may have dielectric material disposed therebetween. Although not shown, the grounding structure 501 may include vias that extend between the metal routing layers 705 to form interconnects between the layers 705.

The grounding structure 501 is disposed on a silicon substrate 715. Although silicon is described, the IC 100 may include any type of semiconductor material. Moreover, the substrate 715 may include crystalline semiconductor as well as other layers. For example, the substrate 715 may be a silicon-on-insulator (SOI) structure. In this embodiment, the portion of the substrate 715 contacting the grounding structure 501 includes an active region 710. In one embodiment, before forming the grounding structure 501, the active region 710 is processed (e.g., doped or etched) to form active devices 720 which can include transistors or other active components. In this example, the active device 720 may form part of the transmitter 105C. For example, the active devices 720 may include a MOSFET used to drive the clock signal onto a clocking network. In one embodiment, the grounding structure 501 includes vias that connect the metal routing layer 705 closest to the silicon substrate 715 to the active devices 720 in the active region 710.

The slots 500 extend through the grounding structure 501 until reaching the active region 710. Although not required, in one embodiment the slots 500 can extend into the silicon substrate 715. In any case, the slots 500 provide a barrier that electrically insulates the metal routing layers 705 on both sides. As such, return currents flowing in the metal routing layers 705 on one side of the slots 500 cannot flow through the slots 500 to reach metal routing layers 705 on the other side. Instead, the return current flows around the short circuit ends of the slots 500 as described above.

The conductive material forming the inductor 305 is disposed on a top surface 725 of the IC 100. Thus, the inductor 305 may be formed after forming the grounding structure 501 on the silicon substrate 715. Further, although not shown, additional slots may be formed in the grounding structure 501 immediately adjacent to the inductor which follow the perimeter of the inductor. Moreover, the grounding structure 501 may include one or more vias coupling the inductor 305 to the metal routing layers 705 forming ground planes.

Figure 8:
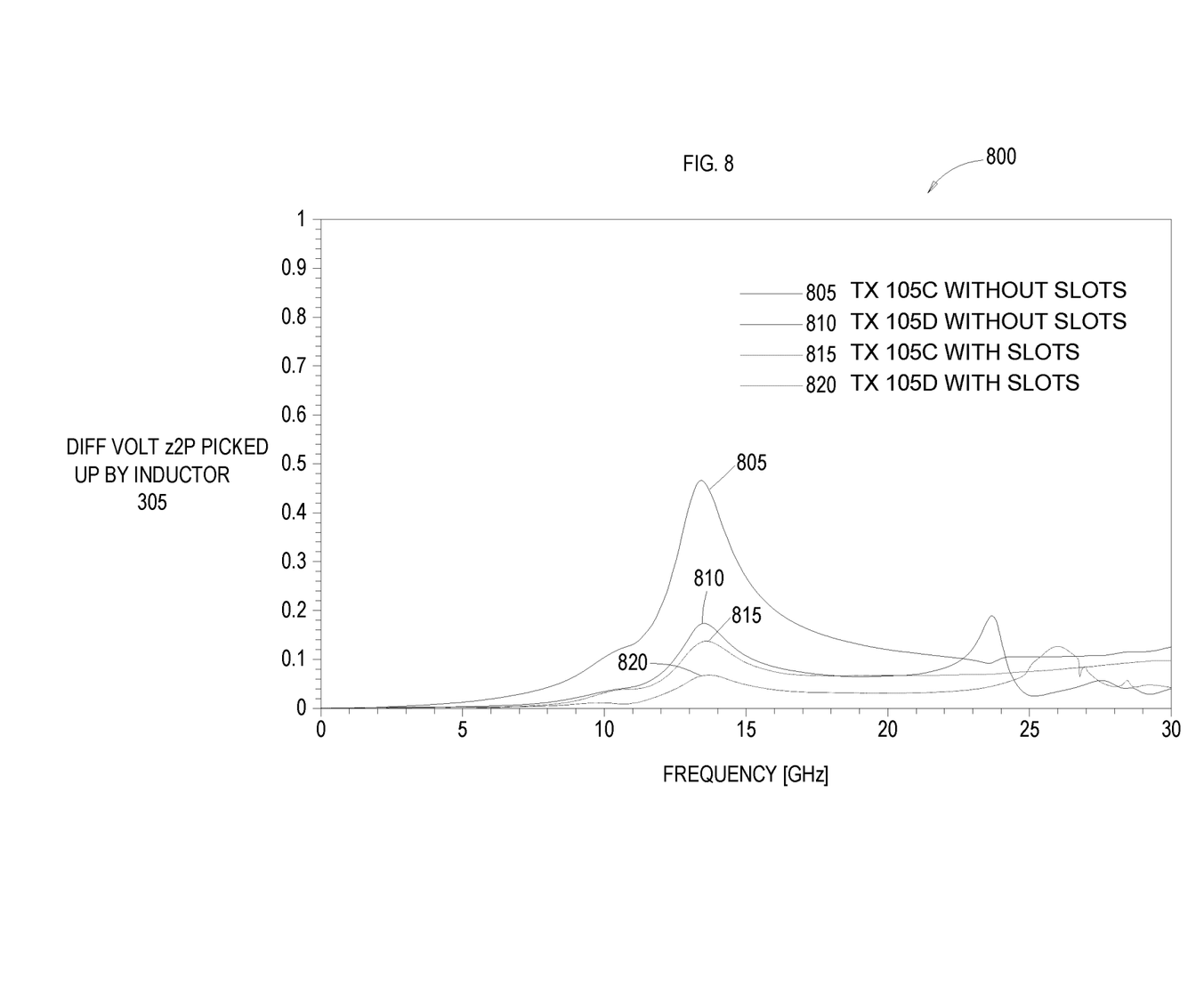
FIG. 8 is a chart illustrating the effect the slots have on transimpedance, according to an example.

FIG. 8 is a chart 800 illustrating the affect the slots have on transimpedance, according to an example. The plot 805 represents the difference in voltage at the inductor 305 caused when the transmitter 105C is active but there are no slots in the grounding structure. The plot 810 represents the difference in voltage at the inductor 305 caused when the transmitter 105D is active but there are no slots in the grounding structure. The plot 815 represents the difference in voltage at the inductor 305 caused when the transmitter 105C is active and there are slots in the grounding structure as shown in FIGS. 5 and 6. The plot 820 represents the difference in voltage at the inductor 305 caused when the transmitter 105D is active and there are slots in the grounding structure as shown in FIGS. 5 and 6.

Comparing the plots 805 and 810 to the plots 815 and 820 illustrates that the slots reduce the coupling between the inductor 305 and the return current caused by the transmitters 105C and 105C. As such, the overall performance of the IC can be improved since less noise is injected into the inductor 305. Thus, the function of any downstream circuitry that rely on the inductor 305 (e.g., the transmitter 105A or 105B in FIG. 1) is improved.

Figure 9:
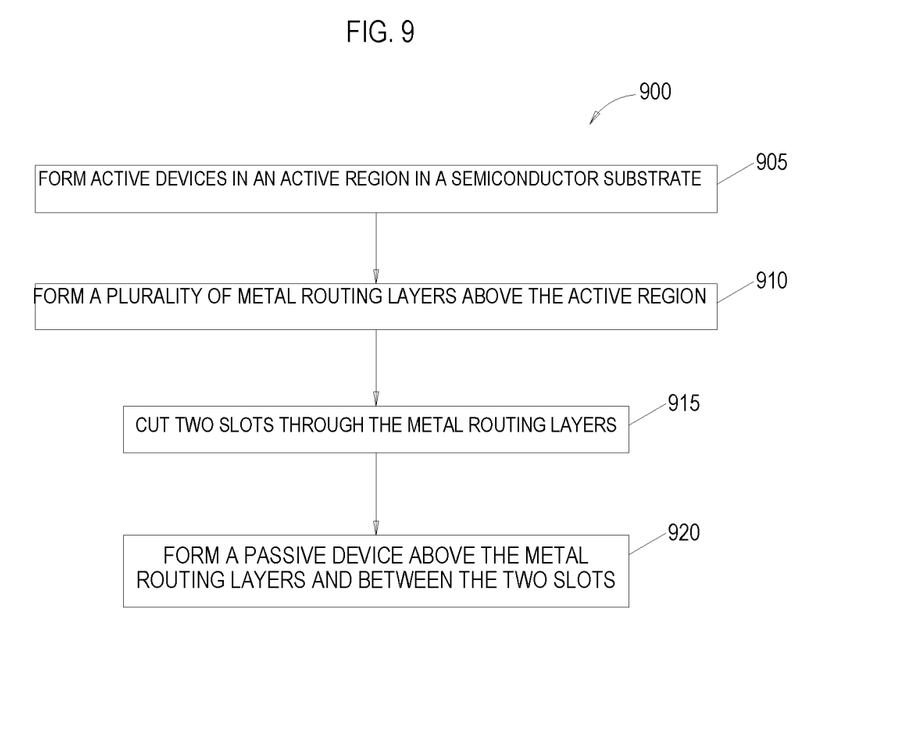
FIG. 9 is a flowchart for fabricating slots in a grounding structure to isolate a passive component from return current, according to an example.

FIG. 9 is a flowchart of a method 900 for fabricating slots in a grounding structure to isolate a passive component from return current, according to an example. At block 905, active devices are formed in an active region in a semiconductor substrate. In one embodiment, the active devices include transistors but are not limited to such. The active devices can be formed using a plurality of different processing steps. For example, the active region may be doped and etched to form the active devices. Further, additional material may be deposited on or in the active region such as polysilicon, dielectric material, metals, and the like to form the active devices.

At block 910, a plurality of metal routing layers is formed above the active region. For example, after the active devices are formed, the plurality of metal routing layers is formed on the active devices to provide interconnections to other regions of the IC. For example, the plurality of metal routing layers may be part of a grounding structure which establishes a power grid or communication network for the IC.

In one embodiment, dielectric layers are interleaved between the plurality of metal routing layers. However, the grounding structure can include vias extending through he dielectric layer that interconnect the metal routing layers. Moreover, additional vias may be used to connect the metal routing layers to the active devices in the active region as well as to components that may be disposed over the metal routing layers.

At block 915, two slots are formed which extend through the metal routing layers. In one embodiment, the slots are formed in parallel with block 910 where the plurality of metal routing layers are formed. That is, as each metal routing layer is formed, portions of the layer are left open to form the two slots. In this manner, the plurality of metal routing layers can be formed at the same time the two slots are formed. Alternatively, in another embodiment, the slots may be formed after the plurality of metal routing layers are formed using any suitable etching technique that can remove the plurality of metal routing layers and dielectric layers to expose the underlying semiconductor substrate.

In one embodiment, the slots have one end that terminates at an edge of the metal routing layers (e.g., open ends) while the opposite end terminates within the metal routing layers (e.g., short circuit ends) as shown in FIGS. 5 and 6.

At block 920, a passive component (e.g., a capacitor or inductor) is formed above the metal routing layers and between the two slots. As discussed above, the slots may reduce the negative impact of return current flowing through the metal routing layers near the passive component. Doing so may reduce the noise injecting into the passive component by the return current.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. An integrated circuit, comprising:
   a grounding structure;
   a source;
   a transmitter, wherein, when the transmitter is active, return current flows through the grounding structure from the source to the transmitter;
   a passive component disposed between the source and the transmitter;
   a first slot extending through the grounding structure, wherein the first slot is between the passive component and the source; and
   a second slot extending through the grounding structure, wherein the second slot is between the passive component and the transmitter, wherein respective first ends of the first and second slots terminate at an edge of the grounding structure.

2. The integrated circuit of claim 1, wherein respective second ends of the first and second slots terminate within the grounding structure such that the return current can flow around the respective second ends but is prevented from flowing around the respective first ends.

3. The integrated circuit of claim 1, further comprising:
   a semiconductor substrate, wherein the grounding structure comprises a plurality of metal routing layers disposed on the semiconductor substrate, wherein the first and second slots extend through the plurality of metal routing layers.

4. The integrated circuit of claim 3, wherein the passive component is disposed over the plurality of metal routing layers.

5. The integrated circuit of claim 4, wherein the passive component comprises one of an inductor and capacitor.

6. The integrated circuit of claim 1, wherein the return current is generated at the source by a magnetic field induced from driving a signal using the transmitter.

7. The integrated circuit of claim 1, further comprising:
   a phase locked loop comprising the passive component; and
   a second transmitter configured to receive a control signal from the phase locked loop when driving a signal.

8. An integrated circuit, comprising:
   a grounding structure;
   a source;
   a sink, wherein return current flows through the grounding structure from the source to the sink;
   an inductor disposed between the source and the sink; and
   a first slot extending through the grounding structure, wherein the first slot is between the inductor and the source, wherein a first end of the first slot terminates at an edge of the grounding structure.

9. The integrated circuit of claim 8, further comprising:
   a second slot extending through the grounding structure, wherein the second slot is between the inductor and the sink, wherein a first end of the second slot terminates at the edge of the grounding structure.

10. The integrated circuit of claim 9, wherein respective second ends of the first and second slots terminate within the grounding structure such that the return current can flow around the respective second ends, wherein the return current is prevented from flowing around the first ends of the first and second slots.

11. The integrated circuit of claim 8, further comprising:
    a transmitter comprising the sink, wherein the return current is generated at the source by a magnetic field induced from driving a signal using the transmitter.

12. The integrated circuit of claim 8, further comprising:
    a semiconductor substrate, wherein the grounding structure comprises a plurality of metal routing layers disposed on the semiconductor substrate, wherein the first slot extends through the plurality of metal routing layers.

13. The integrated circuit of claim 12, wherein the inductor is disposed over the plurality of metal routing layers.

14. A method of fabricating an integrated circuit, the method comprising:
    forming a source in the integrated circuit;
    forming a transmitter in the integrated circuit;
    forming a grounding structure over an active region of a semiconductor substrate, wherein, when the transmitter is active, return current flows through the grounding structure from the source to the transmitter;
    forming a passive component disposed between the source and the transmitter;
    forming a first slot extending through the grounding structure, wherein the first slot is between the passive component and the source; and
    forming a second slot extending through the grounding structure, wherein the second slot is between the passive component and the transmitter, wherein respective first ends of the first and second slots terminate at an edge of the grounding structure.

15. The method of claim 14, wherein respective second ends of the first and second slots terminate within the grounding structure such that return current can flow around the respective second ends but is prevented from flowing around the respective first ends.

16. The method of claim 14, wherein the transmitter comprises at least one active device in an active region of the semiconductor substrate, wherein the return current is generated at the source by a magnetic field induced from driving a signal using the transmitter.

17. The method of claim 14, wherein forming the grounding structure comprises:
   forming a plurality of metal routing layers separated by dielectric material over an active region of the semiconductor substrate.

18. The method of claim 17, wherein the first and second slots extend through the plurality of metal routing layers thereby exposing the active region of the semiconductor substrate.

19. The method of claim 17, wherein the respective first ends of the first and second slots terminate at edges of the plurality of metal routing layers.

* * * * *